United States Patent [19]
Omori et al.

[11] Patent Number: 5,328,761
[45] Date of Patent: Jul. 12, 1994

[54] DIAMOND-COATED HARD MATERIAL, THROWAWAY INSERT AND A PROCESS FOR THE PRODUCTION THEREOF

[75] Inventors: Naoya Omori; Toshio Nomura, both of Itami, Japan

[73] Assignee: Sumitomo Electric Industries, Ltd., Osaka, Japan

[21] Appl. No.: 910,094

[22] PCT Filed: Oct. 4, 1991

[86] PCT No.: PCT/JP91/01359
§ 371 Date: Jul. 14, 1992
§ 102(e) Date: Jul. 14, 1992

[87] PCT Pub. No.: WO92/05904
PCT Pub. Date: Apr. 16, 1992

[30] Foreign Application Priority Data

Oct. 5, 1990 [JP] Japan .................. 2-269214
Feb. 18, 1991 [JP] Japan .................. 3-023495
Feb. 18, 1991 [JP] Japan .................. 3-023496

[51] Int. Cl.⁵ .......................................... B23B 27/14
[52] U.S. Cl. ............................ 428/336; 428/141; 428/156; 428/408; 428/698; 51/307
[58] Field of Search ............... 428/408, 336, 698, 156, 428/141; 51/307

[56] References Cited
FOREIGN PATENT DOCUMENTS
61-106494 5/1986 Japan .
61-151095 7/1986 Japan .
61-201698 9/1986 Japan .
62-202897 9/1987 Japan .

*Primary Examiner*—A. A. Turner
*Attorney, Agent, or Firm*—Wenderoth, Lind & Ponack

[57] ABSTRACT

An object of the present invention is to provide a diamond-coated hard material having a high bonding strength to a substrate and a diamond-coated throwaway insert capable of cutting various light alloys such as Al-Si alloys at a high cutting rate for a long time. This object can effectively be attained by a diamond-coated hard material comprising a sintered body consisting of $Si_3N_4$ as a predominant component, at least a part of the sintered body having a sintered surface at least a part of which is coated with diamond and a diamond-coated throwaway insert having a diamond- or diamond-like carbon-coated layer with a thickness of 0.1 to 200 μm, deposited from gaseous phase, on the surface of a substrate consisting of $Si_3N_4$, as a predominant component, in which the surface state of the substrate is maintained as sintered and a part or whole of the sintered surface is coated with the diamond- or diamond-like carbon-coated layer.

16 Claims, 3 Drawing Sheets

DIAMOND-COATED HARD MATERIAL, THROWAWAY INSERT AND A PROCESS FOR THE PRODUCTION THEREOF

TECHNICAL FIELD

This invention relates to a diamond-coated hard material having a high bonding strength to a substrate and a diamond-coated throwaway insert capable of cutting various light metals such as Al-Si alloys at a high rate for a long time.

BACKGROUND TECHNIQUE

Diamond having many excellent properties for example very high hardness, chemical stability, high heat conductivity, high sound wave propagation speed, etc. has widely been used as hard materials utilizing these properties or diamond or diamond-like carbon coated hard materials, illustrative of which are as follows:

① single crystal diamond, sintered diamonds or diamond-coated cutting tools such as throwaway inserts, drills, microdrills, endmills, etc., which are capable of cutting Al, Cu, various practically used light metals or alloys thereof at a high rate and obtaining well finished surfaces, because of hardly reacting with these metals or alloys.

② various wear resistance tools such as bonding tools capable of working for a long time with a high dimensional precision, because of high wear resistance.

③ various machine parts such as radiating plates.

④ various vibration plates such as speakers.

⑤ various electronic parts.

In the production of artificial diamond, there are methods of forming diamond coating layers from gaseous phase, for example, microwave plasma CVD method, RF-plasma CVD method, EA-CVD method, induction field microwave plasma CVD method, RF hot plasma CVD method, DC plasma CVD method, DC plasma jet method, filament hot CVD method, combustion method and like. These methods are useful for the production of diamond-coated hard materials.

As a surface-coated tool, there have widely been used surface-coated throwaway inserts in which a monolayer or multilayer consisting of carbides, nitrides and carbonitrides of Ti, Hf or Zr or oxide of Al is formed on the surface of a cemented carbide substrate by PVD or CVD method.

Diamond has a very high hardness and chemical stability and hardly reacts with Al, Cu, practically used light metals, etc. as described above. Thus, when diamond is applied to a cutting tool and subjected to cutting of such light metals or alloys thereof at a high rate, the surface of a workpiece is well finished. Accordingly, single crystal diamond, sintered diamond cutting tools or diamond-coated cutting tools have widely been put to practical use.

Since many of the diamond-coated tools are lacking in bonding strength of the diamond-coated layer to a substrate, the diamond-coated layer is stripped to shorten the life in many cases. The reason therefor is given below:

1) Since diamond is a very stable material and does not form compounds with all materials, it is considered that a diamond-coated layer and substrate are bonded by an intermolecular force. The intermolecular force provides a lower bonding strength to a substrate as compared with a coated layer bonded through formation of a chemical compound.

2) The thermal expansion coefficients of diamond and a substrate are so different that a residual stress is caused in a diamond-coated layer and the bonding strength between them is decreased.

At the boundary between a substrate and a diamond-coated layer, the intermolecular force is increased with the increase of the contacted area thereof and the bonding strength of the diamond-coated layer to the substrate is thus increased. The higher is the nuclei-generating density of diamond on the surface of the substrate, the larger is the contacted area of the substrate and the diamond-coated layer.

Thus, there has been proposed a method comprising subjecting the surface of a substrate to etching to remove metals having bad influences upon formation of the diamond coating layer on the substrate surface and thereby increasing the formation density of diamond nuclei on the substrate surface (Japanese Patent Laid-Open Publication No. 201475/1989, etching the surface of a cemented carbide with an acid solution to remove Co metal component and to suppress graphitization of the diamond nuclei; Japanese Patent Laid-Open Publication No. 124573/1986, subjecting the surface of a substrate to a scratching treatment with diamond grains or a diamond wheel and thereby improving the nuclei forming density on the surface of the substrate), etc. However, the resulting bonding strength is not sufficient.

As described above, diamond is chemically stable and does not form intermediate compounds with all materials. When a diamond-coated hard material having an excellent bonding strength is prepared, therefore, such a condition must be provided that a diamond coating layer and a substrate are bonded by a strong physical strength.

As a substrate having substantially the same heat expansion coefficient as diamond, a sintered body containing $Si_3N_4$ as a predominant component or a sintered body containing SiC as a predominant component has been proposed in Japanese Patent Laid-Open Publication No. 291493/1986. According to these proposals, the stripping phenomenon of the diamond-coated layer due to the thermal residual stress can be solved, but there still remains a problem of the surface treatment and under the situation, a diamond-coated layer having a sufficient bonding strength to a substrate has not been obtained.

DISCLOSURE OF THE INVENTION

The inventors have thus made studies noting the surface state of a substrate for the purpose of developing a diamond-coated layer and a substrate having an excellent stripping resistance and consequently, have found that when a substrate is prepared by shaping and sintering a mixed powder of $Si_3N_4$ as a predominant component and forming a diamond-coated layer on the substrate under such a state that the surface is as sintered, a high bonding strength is obtained. The present invention is based on this finding. In this specification, the surface as sintered will sometimes be referred to as "sintered surface".

Furthermore, the inventors have found that a high bonding strength can also be obtained when a sintered and ground substrate is again subjected to a heat treatment to obtain a surface state as sintered before grinding (which will hereinafter be referred to as "heat-treated surface") and a diamond-coated layer is then formed.

Accordingly, the present invention provides (1) a diamond-coated hard material comprising a sintered body consisting of $Si_3N_4$ as a predominant component, at least a part of the sintered body having a sintered surface at least a part of which is coated with diamond and (2) a diamond-coated throwaway insert having a diamond- and/or diamond-like carbon-coating layer with a thickness of 0.1 to 200 μm, deposited from a gaseous phase, on the surface of a substrate consisting of $Si_3N_4$ as a predominant component, in which a partial or whole surface of a substrate having such a surface state as sinteredrd is coated with a diamond- and/or diamond-like carbon-coating layer.

BEST EMBODIMENT FOR PRACTICING THE INVENTION

In addition, the inventors have found that when protrusions having a high bonding strength to a substrate are formed on the surface of the substrate by a chemical or mechanical means and a diamond coating layer is formed thereon, thereby forming such a state that protrusions are intruded into the diamond coating layer, the bonding strength between the diamond coating layer and the substrate is rendered very high. This can be considered to be due to that the contact area of the diamond coating layer with the substrate is increased an and the protrusions have anchor action in the diamond coating layer, whereby the diamond coating layer is hard to be stripped from the substrate.

In the present invention, the roughness is not macroscopic roughness formed by a scratching treatment with (1) a diamond wheel or (2) grinding diamond grains, but roughness in a very small range in a standard length of 10 μm in a diamond coating layer-substrate interface.

The inventors have made various toughened states and consequently, have found that when at least one protrusive part is present in the standard length of 10 μm and the ratio of sum A of the lengths of dent parts to sum B of the lengths of the protrusions is in the range of $0.0 \leq A/B \leq 20$ in the standard length and the protrusions are intruded by 0.2 μm into the diamond-coated layer, a high density strength is obtained. This is calculated by lapping a cross-section of the substrate coated with diamond, observing and photographing to review and model a boundary line of the diamond coating layer-substrate interface.

Figure 1:
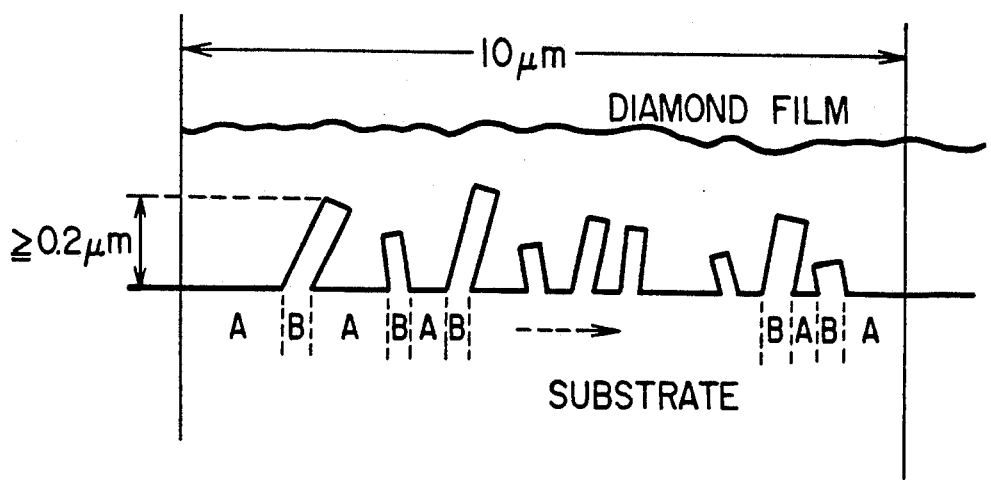
FIG. 1 is a schematic view of a coating layer-substrate interface in one embodiment of the present invention.

In FIG. 1, the state of the diamond-coated layer- or diamond-like carbon-coated layer-substrate interface according to the present invention (I) is schematically shown.

Herein, the ratio of sum A of the protrusion lengths, i.e. ΣA to sum B of the dint lengths, i.e. ΣB must be in the range of $0.05 \leq \Sigma A/\Sigma B \leq 20$ and the intruded lengths of the protrusions are preferably at least 0.2 μm. For example, when one protrusion of 0.5 μm is present per 10 μm, In any case, it is required for the thus formed protrusions that when the standard length is 10 μm in the diamond-and/or diamond-like carbon coated layer-substrate interface, at least one protrusion is formed in this standard length, the ratio of sum B of the lengths of protrusions and sum A of the lengths of the protrusions is in the range of 0.05 to 20 and the protrusions are intruded into the diamond-coated layer. In this case, the intruded length is preferably at least 0.2 μm. When the ratio of sum B of the lengths of protruons and sum A of the lengths of the protrusions is outside the range of $0.05 \leq \Sigma A/\Sigma B \leq 20$, the bonding strength is not improved.

The inventors have made various toughened states and consequently, have found that when the surface roughness in the substrate interface is defined by Rmax of 1.5 to 30 μm in the standard length of 50 μm, a strong bonding strength is obtained. This surface roughness is defined as a surface roughness (Rmax) of a substrate after coated by lapping a cross-section of the substrate coated with diamond, observing and photographing to review a boundary line of the diamond coating layer-substrate interface.

Figure 2:
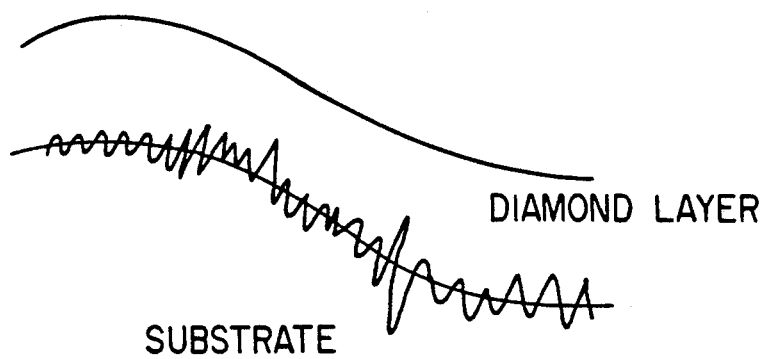
FIG. 2 is a schematic view of a coating layer-substrate interface in another embodiment of the present invention.
Figure 3:
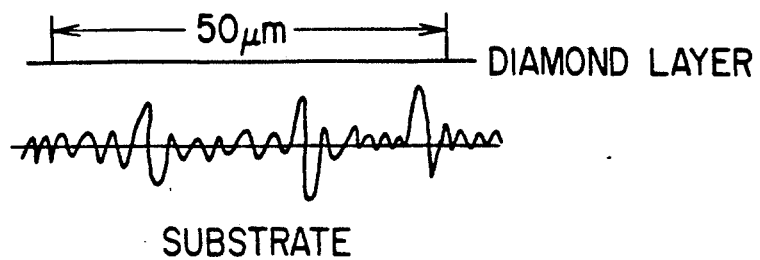
FIG. 3 is a schematic view to illustrate the state shown in FIG. 1 by linearly drawing it.

In FIG. 2, the state of the interface between the diamond-coated layer or diamond-like carbon-coated layer and the intermediate layer according to the present invention is schematically shown. That is, a macroscopic undulation appears in the interface, but Rmax is calculated regarding this undulation as linear as shown in FIG. 3.

In any case, the formed protrusive parts should satisfy the requirements that when a standard length is 50 μm in the interface of a diamond-and/or diamond-like carbon coated layer and a substrate, the surface roughness of the substrate interface is represented by an Rmax of 1.0 to 30 μm in the standard length and the protrusive parts are preferably intruded in the diamond coated layer with at least 0.2 μm. When the surface roughness at the substrate interface is represented by a Rmax of less than 1.0 μm, the bonding strength is not increased, while if more than 30 μm, on the contrary, the bonding strength is lowered.

As a useful method for forming the specified roughness on a substrate, there are ① a method comprising depositing columnar or hexagonal pillar crystal grains and/or needle crystal grains on the surface of a substrate, ② a method comprising removing an etchable binder by etching, ③ a method comprising masking a substrate, etching and then removing the mask, ④ a method comprising physically working, for example, by appllying laser and the like. Depending on the kind of the substrate, a suitable method should be chosen therefrom.

The method ① consists in subjecting a substrate to some heat treatment, freely growing columnar or hexagonal pillar crystal grains or needle crystal grains and/or promoting secondary crystal generation on the surface thereof by the substrate component, the method ② is available for a material composed of a hard phase and a binder phase, differing in corrosive property against acids and alkalies and the method ③ consists in providing a mask in a suitable pattern using a photomask, etching and then removing the mask by etching.

The reasons for selecting a hard material containing $Si_3N_4$ as a predominant component as a substrate are that (1) the thermal expansion coefficient of $Si_3N_4$ is similar to that of diamond and thermal residual stress is hard to occur and (2) a toughened state can readily be formed on the surface of the substrate by the above described method ①, because the substrate is formed by shaping and sintering a mixed powder containing $Si_3N_4$ as a predominant component, columnar or hexagonal pillar crystal texture freely grows and coarse columnar or hexagonal pillar crystals are thus allowed to be present on the substrate surface. The following two advantages can be given as an effect by the presence of the freely grown columnar or hexagonal pillar crystal texture:

1) Since the columnar or hexagonal pillar crystal texture of $Si_3N_4$ freely grows on the surface to form coarse columnar or hexagonal pillar crystals thereon, the surface is more toughened than a ground suface to enlarge the contacted areas of the substrate and diamond-coated layer.

2) The grain boundary becomes a specific point, thus resulting in tendency of generating diamond nuclei.

In the case of the ground surface, there is no presence of the freely grown columnar or hexagonal pillar crystal texture of $Si_3N_4$, nor so roughned surface as in the case of the sintered surface, and the grain boundary of crystal grains is not clear.

In order to promote generation of diamond nuclei on the whole surface of an insert at the initial period of coating, it is preferable to carry out the commonly used scratching treatment with diamond grains. During the same time, this scratching treatment is more preferably carried out by adding the substrate and diamond grains to a solvent such as water, ethyl alcohol, acetone, etc. and then applying ultrasonic wave thereto, since a scratching treatment by pressing hard diamond grains against the substrate in phyiscal manner results in breakage of the resulting protrusions. Diamond nuclei are uniformly formed on the whole protrusive and non-protrusive parts of the substrate surface by this scratching treatment, whereby it is rendered possible to form such a state that the protrusions are intruded into the diamond coated layer.

The composition of a substrate is preferably obtained by sintering a mixed powder of $Si_3N_4$ powder, as a predominant component, containing at least 50% of $\alpha$-$Si_3N_4$ and 1 to 50 wt % of at least one sintering assistant selected from the group consisting of $Al_2O_3$, $Y_2O_3$, MgO, AlN and $SiO_2$. If the content of $\alpha$-$Si_3N_4$ is less than 50 %, formation of $\beta$-$Si_3N_4$ columnar or hexagonal pillar structure is insufficient even if the sintering is carried out under any conditions, and the strength and toughness of the substrate itself are lowered. It is known that $Si_3N_4$ is a material of covalent bond and the sintering property is inferior. However, when at least one of $Al_2O_3$, $Y_2O_3$, MgO, AlN and $SiO_2$ is added in a proportion of 1 to 50 wt %, the sintering property is improved and formation of $\beta$-$Si_3N_4$ columnar or hexagonal pillar structure is promoted. When the sum of these additives is more than 50 wt %, the strength of the sintered body itself is lowered and thus the addition of at most 50 wt % is preferable. Furthermore, hardening materials such as various compounds including carbides, nitrides or carbonitrides and borides of Ti, and/or additives capable of improving the high temperature property such as $ZrO_2$ and $IfO_2$ can of course be used as other components than the above described sintering assistants. The sintering temperature should preferably be in the range or 1,600° to 2,000° C., since if lower than 1,600° C., the grain growth is not sufficient and the strength of the sintered body is markedly lowered, while if higher than 2,000° C., decomposition of $Si_3N_4$ starts. The ambient gas is generally $N_2$ gas, since the use of other gases than $N_2$ gas results in decomposition of $Si_3N_4$. If the pressure thereof is less than 1 atm, $Si_3N_4$ is decomposed while if more than 3,000 atm, operation on a commercial scale is difficult. Thus, it is preferable to use an $N_2$ gas atmosphere in the range of 1 to 3,000 atm.

The sintering time is preferably 30 minutes to 5 hours, since if less than 30 minutes, compacting of crystal grains is insufficient, while if more than 5 hours, the crystal grains are coarsened to lower the strength.

When the substrate is sintered under the above described sintering conditions, presence of $Si_3N_4$ hexagonal pillar crystals is found on the surface of the substrate. Coating of the sintered surface is also advantageous from such an economical point of view that the production cost can be reduced by a working cost required for grinding and finishing. The thus obtained diamond-coated high hardness material can widely be applied to various machine parts, for example, throwaway inserts, microdrills, drills, endmills, routers, reamers, wear resistance tools, bonding tools, grinding wheels, dressers, printer heads, etc.

As to a throwaway insert having a complicated shape or throwaway insert for which a high dimensional precision is required, a partial or whole surface of once sintered insert is ground, optionally subjected to an edge treatment, and then heat-treated in $N_2$ gas and/or an inert gas atmosphere at a temperature range of 1,300° to 2,000° C. The gas pressure range is 1 to 3,000 atm. Thus, the whole surface of the insert is converted into a heat treated surface. As the heat treatment condition, the temperature range is adjusted to 1,300° to 2,000° C., since if lower than 1,300° C., the structure of the ground surface is not changed, while if higher than 2,000° C., decomposition reaction of $Si_3N_4$ takes place. The ambient gas is composed of $N_2$ gas and/or an inert gas, since the use of other gases results in decomposition of $Si_3N_4$.

In the ground surface of the substrate, presence of $Si_3N_4$ columnar or hexagonal pillar crystal is not found, but when this throwaway insert is heat-treated under the above described condition, presence of $Si_3N_4$ columnar or hexagonal pillar crystal is found in the heat-treated surface as in the sintered surface.

Depending on the dimensional precision required, a part of a throwaway insert whose whole surface is converted into the heat-treated surface is subjected to grinding.

When a diamond-coated layer is formed on tile heat-treated surface, a bonding strength is obtained which is much higher than that on the ground surface or comparable to that on the sintered surface. This is due to that tile hexagonal pillar crystal texture is present on the heat-treated surface similarly to the case of the sintered surface.

When the mean major axis/minor axis ratio of the hexagonal pillar crystal is less than 1.5 or there are no hexagonal pillar crystals having major axis of exceeding 2 $\mu$m, improvement of the bonding strength is hardly observed.

Since a diamond-coated layer having a high bonding strength and having no thermal residual stress can be formed in the present invention, it is rendered possible to provide a layer with a thickness of more than 200 $\mu$m, which exceeds the layer thickness of the commonly used hard material-coated material.

As to the thickness of the coated layer, if less than 0.1 $\mu$m, no improvement of the wear resistance by the coated layer is found, while if more than 200 $\mu$m, further improvement of the wear resistance cannot be given and this is not economical for hard materials or throwaway inserts. Therefore, a thickness of 0.1 to 200 μm is preferable.

The foregoing illustration is conducted as to a case where diamond is coated, but the present invention can be applied with similar benefits to cases where diamond-like carbon or diamond having other crystal structure is present in a diamond-coated layer, one or more of these layers are coated and the diamond- or diamond-like carbon-coated layer contains foreign atoms such as boron, nitrogen, etc.

In this specification, the upper surface of the insert means a rake face and the lower surface means a surface opposite to the uppe rsurface.

The following examples are given in order to illustrate the present invention in detail.

EXAMPLE 1

A surface hard material of the present invention will specifically be illustrated by examples.

A $Si_3N_4$-based ceramic mixed powder having a composition of $Si_3N_4$-4 wt % $Al_2O_3$-4 wt % $ZrO_2$-3 wt % $Y_2O_3$ was sintered in an $N_2$ gas atmosphere of 5 atm at 1,800° C. for 1 hour, thus obtaining a throwaway insert with a shape of SPG 422 having a columnar or hexagonal pillar crystal structure having a mean major axis of 2 μm and a mean minor axis of 4 μm formed on the surface thereof.

Figure 4:
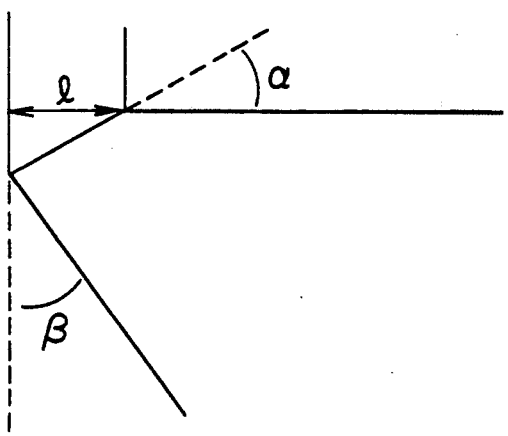
FIG. 4 is a schematic view of one embodiment to show a treatment of an edge used in Example.

For comparison of the sintered surface and ground surface, the following base insert was prepared. An edge treatment of the insert is schematically shown in FIG. 4, in which a designates a negative land angle, β designates a relief angle and l designates a negaland width, α, β and l being respectively 25°, 11° and 0.05 mm.

The following samples were prepared:

Nos. 1 and 2: inserts having whole surfaces as sintered

No. 3: insert subjected to edge treatment for NL working of 0.05×25° and having other part as sintered No. 4: insert subjected to upper and lower surface grinding and to above described edge treatment and having flank face as sintered surface No. 5: insert subjected to flank face grinding and above dsecribed edge treatment and having upper and lower surfaces as sintered In order to confirm the effect of the heat-treated surface, the above described insert was subjected to grinding of the upper and lower surfaces and flank face and to the NL edge treatment of 0.05×25°, as dsecribed above. During the same time, it was found that there was no hexagonal pillar crystal structure on the ground surface of the throwaway insert. This insert was tehn subjected to a heat treatment in an $N_2$ gas atmosphere at 1,700° C. and 5 atm for 1 hour.

Nos. 6 and 7: inserts having whole surfaces as sintered

No. 8: insert having only an edge (referred to as NL surface) as ground and having flank face and rake face as heat-treated surface No. 9: insert having upper and lower surfaces and NL surface as ground and having only flank face as heat-treated surface No. 10: insert having flank face and NL surface as ground and having only upper and lower surfaces as heat-treated surface No. 11: insert having flank face and upper and lower surfaces as ground and having only NL surface as heat-treated surface No. 12: insert having flank face as ground and having only upper and lower surfaces and NL surface as heat-treated surface No. 13: insert having upper and lower surfaces as ground and having only flank face and NL surface as heat-treated surface Under this heat treatment condition, a columnar or hexagonal pillar crystal structure of $Si_3N_4$ with a mean minor axis of 1.5 μm and a mean major axis of 3 μm was found on the surface as ground of the throwaway insert on which no hexagonal pillar crystal structure had been found before the heat treatment.

Using a μ-wave plasma CVD apparatus of 2.45 GHz, these cutting inserts were heated at 1,000° C. and maintained in a mixed plasma of hydrogen-2% methane adjusted to a total pressure of 80 Torr for 4 to 100 hours, thus forming diamond-coated layer on the whole upper surface of the insert, near the edge part of the flank face and on the NL surface, and diamond-coated throwaway inserts of the present invention, Sample Nos. 1 to 13 were prepared as shown in Table 1.

For comparison, Comparative Insert No. 1 having the same shape and same composition, having the upper and lower surfaces ground and having been subjected to the above described edge treatment and Comparative Insert No. 2 having the diamond-coated layer formed thereon were prepared.

In this test, it was confirmed by the Raman spectrometry that the coated layer deposited on the surface of the substrate had a peak of 1,333 cm$^{-1}$ characteristic of the diamond coated layer and/or diamond-like carbon coated layer.

TABLE 1

| Sample No. | Surface State of Insert | | | Thickness of Diamond-Coated Layer (μm) |
|---|---|---|---|---|
| | Flank Face | Rake Face | NL Surface | |
| Our Invention | | | | |
| 1 | A*1 | A | — | 4.5 |
| 2 | A | A | — | 160.0 |
| 3 | A | A | C | 6.0 |
| 4 | A | C | C | 5.5 |
| 5 | C*3 | A | C | 6.5 |
| 6 | B*2 | B | B | 5.0 |
| 7 | B | B | B | 150.0 |
| 8 | B | B | C | 6.5 |
| 9 | B | C | C | 7.5 |
| 10 | C | B | C | 7.5 |
| 11 | C | C | B | 7.0 |
| 12 | C | B | B | 7.0 |
| 13 | B | C | B | 7.0 |
| Comparative Insert | | | | |
| 1 | whole ground surface | | | — |
| 2 | whole ground surface | | | 7.0 |

Note:
*1 A = sintered surface;
*2 B = heat-treayed surface;
*3 C = ground surface Using these cutting inserts, intermittent cutting tests were carried out under the following conditions.

| Workpiece to be cut: | Al-24 wt % Si alloy |
|---|---|
| Cutting Speed: | 300 m/min |
| Feed: | 0.1 mm/rev |
| Cutting Depth: | 0.2 mm |

When the flank wear width, the wear state of the edge and the deposition state of the workpiece, after 2 and 10 minutes, were observed the results as shown in Table 2 were obtained.

As is evident from the results shown in Table 2, the diamond-coated throwaway inserts of the present invention, Sample Nos. 1 to 11 showed better peeling resistance and more excellent wear resistance as compared with the cutting inserts of the prior art, Comparative Sample Nos. 1 and 2.

These results told that when the NL surface and/or flank face were ground surfaces, slight peeling was found. This teaches that when the flank face or NL surface is the sintered surface, the bonding strength of the diamond-coated layer to the substrate is considerably high.

It is also apparent that in comparison of the diamond-coated throwaway inserts of the present invention, i.e. Sample Nos. 1 to 5 with Sample Nos. 6 to 10, there is no difference in property between the sintered surface and heat-treated surface.

present invention, coated with diamond of 4 to 20 μm in layer thickness.

For comparison, a comparative insert, Comparative Sample No. 3, was prepared by using a substrate having the same shape and composition as described above without conducting the heat treatment, and providing a diamond-coated layer on the insert having no hexagonal pillar crystal or silicon nitride on the surface thereof (The ultrasonic wave treatment was not carried out for the comparative sample).

In this test, it was confirmed by the Raman spectrometry that the coated layer deposited on the surface of the substrate had a peak of 1,333 cm$^{-1}$ characteristic of diamond. layer.

Using these cutting inserts, intermittent cutting tests were carried out under the following conditions.

| Workpiece to be cut: | Al-24 wt % Si alloy (block material) |
|---|---|
| Cutting Speed: | 400 m/min |

TABLE 2

| Sample No. | After 2 Minutes | | After 10 Minutes | |
|---|---|---|---|---|
| | Flank Wear Width (mm) | Wear State Deposition State of Workpiece | Flank Wear Width (mm) | Wear State Deposition State of Workpiece |
| 1 | | Measurement was impossible because of no wearing. | 0.07 | normal wear, no peeling, no deposition |
| 2 | | | 0.05 | normal wear, no peeling, no deposition |
| 3 | | | 0.10 | slight peeling on NL face |
| 4 | | | 0.12 | " |
| 5 | | | 0.21 | slight peeling on flank face and NL surface |
| 6 | | | 0.08 | normal wear, no peeling, no deposition |
| 7 | | | 0.05 | normal wear, no peeling, no deposition |
| 8 | | | 0.11 | slight peeling on NL face |
| 9 | | | 0.12 | " |
| 10 | | | 0.20 | slight peeling on flank face and NL surface |
| 11 | | | 0.18 | slight peeling on flank face |
| 12 | | | 0.16 | slight peeling on flank face |
| 13 | | | 0.09 | normal wear, no peeling, no deposition |
| Comparative Insert | | | | |
| 1 | 0.45 | normal wear, large deposition | | broken by cutting for 2 minutes |
| 2 | 0.23 | large peeling | | |

EXAMPLE 2

Throwaway inserts with a shape of SPG 422 were prepared by the use of, as a substrate, silicon nitride-based ceramics (specifically, Composition A: Si$_3$N$_4$- 4 wt % Al$_2$O$_3$-4 wt % ZrO$_2$-3 wt % Y$_2$O$_3$ and Composition B: Si$_3$N$_4$- 2 wt % Al$_2$O$_3$-5 wt % Y$_2$O$_3$) and then heat-treated under conditions as shown in Table 3. The states of hexagonal pillar crystals generated during the same time were shown in Table 3. The inserts of the present invention, Sample Nos. 22 and 23 were outside the scope of the preferable embodiment. Each of these inserts and 2 g of diamond grains each having a grain diameter of 8 to 16 μm were added to ethyl alcohol, to which supersonic wave vibration was applied for 15 minutes. Using a 2.45 GHz microwave plasma CVD apparatus, the thus resulting insert was heated at 1,000° C. and maintained in a mixed plasma of hydrogen-2% methane at a total pressure of 80 Tort for 4 to 20 hours to prepare cutting inserts, Sample Nos. 14 to 23 of the

| Feed: | 0.1 mm/rev |
|---|---|
| Cutting Depth: | 0.5 mm |

When the flank wear width, the wear state of the edge and the deposition state of the workpiece, after 3 and 10 minutes, were observed, the results as shown in Table 3 were obtained.

When the insert after the cutting test was cut, subjected to lapping and then the interface of the substrate and diamond coated layer was observed by an optical microscope and electron microscope, the inserts of the present invention, Sample Nos. 14 to 21 gave the results that silicon nitride hexagonal pillar crystals were intruded into the diamond-coated layer by at most 1 to 5 μm, 3 to 5 protrusions were present in the standard length of 10 μm to obtain an A/B ratio of 0.1 to 10 μm or in the interface between the substrate and diamond-coated layer, the surface roughness was represented by an Rmax of 1 to 8 in the standard length of 50 μm.

Sample Nos. 22 and 23 were outside the scope of the preferred embodiment of the present invention.

In the comparative insert, on the contrary, there were found no silicon nitride hexagonal pillar crystals in the interface of the substrate and diamond-coated layer, nor intrusion of the substrate into the diamond-coated layer.

Utility and Possibility on Commercial Scale

The present invention can be applied to various cutting tools such as not only throwaway inserts but also drills, microdrills, endmills, reamers, routers, etc., wear resistance tools such as TAB tools, capillaries, etc., various grinding wheels, machine parts and the like.

TABLE 3

| Sample No. | Composition | Heat Treatment Temperature (°C.) | Time (hr) | Conditions Atmosphere | State of Hexagonal Pillar Crystal | | | | Thickness of Diamond-Coated Layer (μm) | Cutting Test Results | |
|---|---|---|---|---|---|---|---|---|---|---|---|
| | | | | | Mean Minor Axis (μm) | Mean Major Axis (μm) | Maximum Major Axis (μm) | Mean Aspect Ratio | | Flank Wear Width (mm) | State of Edge |
| 14 | A | 1800 | 30 | 5 atm N$_2$ | 2 | 8 | 10 | 4 | 10 | 0.03 | normal wear |
| 15 | A | 1800 | 40 | " | 2 | 8 | 12 | 4 | 10 | 0.04 | " |
| 16 | B | 1820 | 60 | " | 2.5 | 9 | 14 | 3.6 | 12 | 0.03 | " |
| 17 | B | 1750 | 60 | 10 atm N$_2$ | 2 | 5 | 7 | 2.5 | 8 | 0.05 | " |
| 18 | B | 1750 | 60 | 10 atm N$_2$ | 2 | 5 | 7 | 2.5 | 4 | 0.07 | " |
| 19 | B | 1820 | 30 | 100 atm N$_2$ | 2 | 8 | 11 | 4 | 20 | 0.03 | " |
| 20 | A | 1700 | 120 | " | 1 | 5 | 7 | 5 | 10 | 0.04 | " |
| 21 | B | 1650 | 120 | 1000 atm N$_2$ | 0.8 | 4 | 5 | 5 | 10 | 0.05 | " |
| 22 | A | 1750 | 10 | 5 atm N$_2$ | 0.5 | 1.5 | 1.8 | 3 | 10 | 0.08* | large peeling of diamond layer* |
| 23 | B | 1800 | 5 | 100 atm N$_2$ | 0.8 | 1.2 | 1.5 | 1.5 | 10 | 0.10* | large peeling of diamond layer* |
| Comparative Insert | | | | | | | | | | | |
| 3 | A | — | — | — | — | — | — | — | 10 | 0.12* | large peeling of diamond layer* |

(Note)
*data after 30 min, other data being after 10 min

We claim:

1. A diamond-coated hard material comprising a sintered body consisting of Si$_3$N$_4$ as a predominant component, at least a part of the sintered body having a sintered surface at least a part of which is coated with diamond.

2. A diamond-coated hard material having a diamond-coated layer formed on the surface of a hard material consisting of Si$_3$N$_4$ as a predominant component, in which:
   (1) microscopic roughness is present on the surface of the substrate,
   (2) at least one protrusive part is present in the standard length of 10 μm in a diamond-coated layer and substrate interface,
   (3) the ratio of sum A of the lengths of dent parts to sum B of the lengths of the protrusive parts is in the range of 0.05≦A/B≦20 in the standard length in the interface, and
   (4) the protrusive parts are intruded into the diamond-coated layer.

3. A diamond-coated hard material having a diamond- and/or diamond-like carbon-coated layer formed on the surface of a hard material consisting of Si$_3$N$_4$ as a predominant component, in which:
   (1) microscopic roughness is present on the surface of the substrate and
   (2) the protrusive parts are defined by a surface roughness represented by an Rmax of 1.5 to 30 μm in the standard length of 50 μm in the diamond-coated layer and substrate interface.

4. The diamond- or diamond-like carbon-coated hard material as claimed in claim 2 or 3, wherein the protrusive parts are intruded into the diamond-coated layer by at least 0.2 μm.

5. The diamond- or diamond-like carbon-coated hard material as claimed in any of claims 2 to 4, wherein the protrusive parts are composed of silicon nitride crystals and/or silicon nitride-containing crystals and/or sialon.

6. A diamond-coated throwaway insert having a diamond- or diamond-like carbon-coated layer with a thickness of 0.1 to 200 μm, deposited from gaseous phase, on the surface of a substrate consisting of Si$_3$N$_4$ as a predominant component, in which the surface state of the substrate is maintained as sintered and a part or whole of the sintered surface is coated with the diamond- or diamond-like carbon-coated layer.

7. The diamond-coated throwaway insert as claimed in claim 6, in which at least a part or whole of each of the rake face and flank face of the insert is coated with the diamond- or diamond-like carbon-coated layer in such a manner that only the upper and lower surfaces of the sintered throwaway insert substrate or the rake face is ground and the flank face is maintained as sintered.

8. The diamond-coated throwaway insert as claimed in claim 6, in which a part or whole of each of the edge-treated surface, the rake face and flank face of the insert is coated with the diamond- or diamond-like carbon-coated layer in such a manner that the sintered throwaway insert substrate is subjected to an edge treatment, only the upper and lower surfaces or the rake face is ground and the flank face is maintained as sintered.

9. The diamond-coated throwaway insert as claimed in claim 6, in which a part or whole of each of the edge-treated surface, the rake face and flank face of the insert is coated with the diamond- or diamond-like carbon-coated layer in such a manner that the sintered throwaway insert substrate is subjected to an edge treatment, the upper and lower surfaces or the rake face and the flank face are maintained as sintered.

10. The diamond-coated throwaway insert as claimed in claim 6, in which a part or whole of the sintered throwaway insert substrate is ground and optionally subjected to an edge treatment, and is then subjected to a heat treatment to maintain the whole surface of the insert as heat-treated, and a part or whole of each of the edge-treated surface, the rake face and flank face of the insert is coated with the diamond- or diamond-like carbon-coated layer.

11. The diamond-coated throwaway insert as claimed in claim 6, in which a part or whole of the sintered throwaway insert substrate is ground and optionally subjected to an edge treatment, and is again subjected to a heat treatment to maintain the whole surface of the insert as heat-treated, and after grinding a partial or whole surface of the insert, a part or whole of each of the edge-treated surface, the rake face and flank face of the insert is coated with the diamond- or diamond-like carbon-coated layer.

12. The diamond-coated hard material or diamond-coated throwaway insert as claimed in anyone of claims 1 to 11, wherein a freely grown columnar or hexagonal pillar crystal structure of $Si_3N_4$ is present on the surface of the insert substrate.

13. The diamond-coated hard material or diamond-coated throwaway insert as claimed in claim 12, wherein the $Si_3N_4$ columnar or hexagonal pillar crystal has a mean major axis/minor axis ratio of 1.5.

14. The diamond-coated hard material or diamond-coated throwaway insert as claimed in claim 12, wherein at least a part of the $Si_3N_4$ columnar or hexagonal pillar crystal has a mean major axis of at least 2 $\mu$m.

15. A process for the production of a diamond-coated throwaway insert, which comprises sintering a mixed powder to be a substrate, comprising $Si_3N_4$ powder containing at least 50 % of a $Si_3N_4$, as a predominant component, and 1 to 50 wt % of at least one sintering assistant selected from the group consisting of $Al_2O_3$, $Y_2O_3$ MgO AlN and $SiO_2$ at a temperature of 1,600° to 2,000° C. in a gaseous $N_2$ atmosphere for 30 minutes to 5 hours, converting at least the rake face thereof into a sintered surface or heat-treated surface and then coating at least the rake face with diamond.

16. The process for the production of a diamond-coated throwaway insert, as claimed in claim 15, wherein the heat-treated surface is obtained by grinding the silicon nitride sintered body and then subjecting to a heat treatment at a temperature of 1,300° to 2,000° C. in $N_2$ gas or an inert gas atmosphere of 1 to 3,000 atm.

* * * * *